Dec. 1, 1970 YASUO NANNICHI 3,544,855

VARIABLE-FREQUENCY MICROWAVE OSCILLATOR ELEMENT

Filed Oct. 16, 1967

INVENTOR.
YASUO NANNICHI
BY
Hopgood & Calimafde
ATTORNEYS

United States Patent Office 3,544,855
Patented Dec. 1, 1970

3,544,855

VARIABLE-FREQUENCY MICROWAVE OSCILLATOR ELEMENT

Yasuo Nannichi, % Nippon Electric Company, Ltd., Tokyo, Japan

Filed Oct. 16, 1967, Ser. No. 675,553
Claims priority, application Japan, Oct. 29, 1966, 41/71,249
Int. Cl. H01l 9/00
U.S. Cl. 317—234 4 Claims

ABSTRACT OF THE DISCLOSURE

The frequency of oscillation of a semiconductor microwave oscillator is controlled in a desired manner by injecting into the drift region of an IMPATT type diode, carriers having an opposite polarity to that of the drift carriers in said drift region.

BACKGROUND OF THE INVENTION

It has been publicly known that the p-n junction in a semiconductor element biased in reverse and mounted in a microwave resonant cavity can initiate avalanche transit-time oscillations at a microwave frequency caused by avalanche breakdown. Known among such semiconductor elements are the Read diode having an n-p-i-p junction structure and the Avalanche diode having a p-n or a p-i-n junction structure. These diodes are named generically as an "impact avalanching, transit-time diode" or an "IMPATT diode." Details of such diodes are described in various articles, including an article by W. T. Read "A Proposed High-Frequency Negative Resistance Diode" in the Bell System Technical Journal, vol. 37, pp. 401–466, March 1958, an article by R. L. Johnston et al. "A Silicon Diode Microwave Oscillator" in the Bell System Technical Journal, vol. 44, pp. 369–372, February 1965, and an article by T. Misawa "Negative Resistance in p-n Junctions Under Avalanche Breakdown Conditions, Parts I and II" in the Proc. IEEE, vol. ed–13, pp. 137–151, January 1966.

It has been explained that the basic mechanism underlying the sustenance of microwave oscillations with the Read diode is the so-called IMPATT phenomenon, i.e., a band-pass-type negative resistance occurs in the Read diode by virtue of a delay due to the build-up time of the avalanche together with the transit-time of carriers traversing the drift region of the Read diode under reverse bias. When the phenomenon of avalanche breakdown is caused to build up at the p-n junction, particularly in the Read diode under reverse bias to initiate microwave oscillations, the oscillation frequency is determined primarily by the impurity concentration in the drift region in the diode and the transit-time during which the carriers traverse the drift region or layer. In other words, the microwave oscillation frequency thus generated would be specific to the operating diode; causing oscillations to initiate at an arbitrarily desired microwave frequency was not feasible, nor was it possible to cause an appreciable degree of frequency shift.

OBJECTS OF THE INVENTION

The principal object of this invention is to provide semiconductor elements as microwave oscillators in which their operating frequencies may be varied in a desired manner.

All of the objects, features and advantages of this invention and the manner of attaining them will become more apparent and the invention itself will be best understood by reference to the following description of the invention taken in conjunction with the accompanying drawing.

SUMMARY OF THE INVENTION

In accordance with the principles of this invention, carriers having an opposite sign to that of the drift carriers are injected into the drift region in an impact avalanching, transit-time diode (hereinafter referred to simply as an IMPATT diode) and the effective drift distance of the carriers injected into the drift region is caused to vary by the phenomenon of recombination of the injected carriers and the drift carriers so that the frequency of microwave oscillation can be controlled at a desired value.

DESCRIPTION OF PREFERRED EMBODIMENTS

Figure 1A:
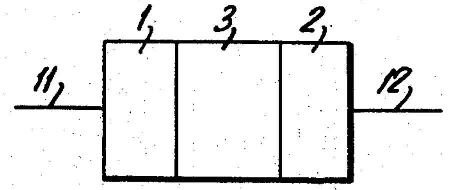
FIGS. 1*a* and 1*b* each illustrate a schematic cross section of a conventional semiconductor element as a microwave oscillator.
Figure 1B:
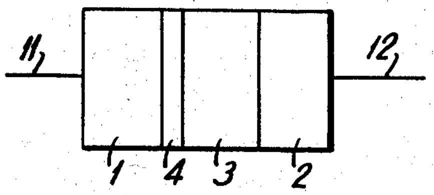

The structures of the p-i-n junction diode (or Avalanche diode) and the Read diode of FIGS. 1*a* and 1*b*, respectively, shown in schematic cross section, are typical of the conventional IMPATT diode structure. The structures of these diodes are composed of an n (or p) region 1, a p (or n) region 2, an i region 3 (to become the drift region under reverse bias) as in FIG. 1*a* and also a p (or n) region 4 as in FIG. 1*b*. The operating frequency of any of these diodes is fixed and determined by the time required for carriers (holes or electrons) to traverse the intrinsic (drift) region 3. Since the saturated drift velocity of the carriers is approximately constant, the transit-time of the carriers is approximately proportional to the width of the drift layer.

Figure 2:
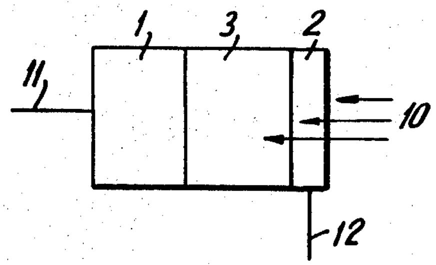
FIG. 2 is a schematic cross section of a semiconductor element as a microwave oscillator according to one preferred embodiment of this invention.

FIG. 2 which illustrates a first preferred embodiment of this invention which comprises a p-i-n structure diode including an n region 1, a p region 2, and an i region 3. Now let it be assumed that avalanche breakdown has been built up by applying a positive and a negative potential respectively to the n region 1 through a lead 11 and to the p region 2 through a lead 12. Under the condition in which holes generated at the boundary of the regions 1 and 3 can reach the p region 2 through the i region 3, suppose that electrons 10 are injected from a vacuum into the p region 2 by the electron impact method. Then, part of the injected electrons penetrate through the p region 2 and reach the i region to recombine with the holes which are traversing the drift region. This is to say that the recombination occurs before the holes reach the p region 2 and accordingly, the effective drift distance of the holes is contracted and the operating frequency of this p-i-n diode becomes higher than will be obtained prior to performing electron impact.

Figure 3:
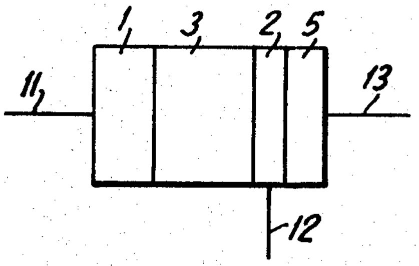
FIGS. 3, 4, 5*a* and 5*b* are, respectively, schematic cross sections of various semiconductor elements as microwave oscillators according to other preferred embodiments of this invention.
Figure 4:
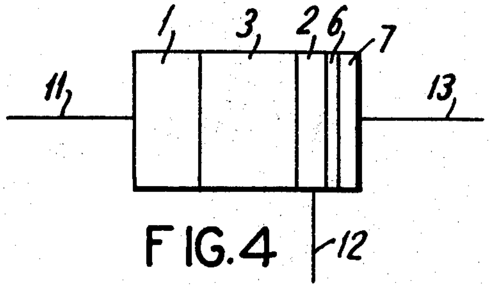

Referring to the IMPATT (Avalanche) diodes, shown also in schematic cross sectional form in FIGS. 3 and 4 as second preferred embodiments of this invention, it will be seen that these structures can be fabricated by adding an n (or p) region 5 or a combination of an insulating layer 6 and a metal layer 7 to the IMPATT diode structure shown in FIG. 1*a*.

By applying a negative potential to lead 13 to maintain the potential of the n region 5 or the metal layer 7 negative with respect to p region 2 and thereby injecting electrons into the p region 2 from the n region 5 or the metal layer 7, it becomes possible to increase the electron density in the p region 2 and thus to raise the operating frequency to a value higher than would be obtained with no control voltage applied.

It is to be noted that injection of electrons (as shown in FIG. 2) into, or the addition of an n (or p) region 5 (as shown in FIG. 3) or a combination of the insulating layer 6 and the metal layer 7 (as shown in FIG. 4) to the IMPATT (p-i-n junction Avalanche) diode of FIG. 1*a* can be similarly applied to the other IMPATT diodes, i.e. to the Read diode shown in FIG. 1*b* and to the p-n junction Avalanche diode, whereby similar effects are obtained, according to this invention.

An IMPATT diode structure of cylindrical shape, approximately 50$\mu$ in diameter, according to a preferred embodiment of this invention shown in FIG. 3 comprises: an i region 3 containing acceptor type impurities such as boron of the order of $6 \times 10^{12}$/cc. in a zero-dislocated silicon single crystal wafer approximately 100$\mu$ in width; a p region 2, approximately 3$\mu$ in width, in which gallium is diffused as the impurity and being of the order of $3 \times 10^{16}$/cc.; an n region 1 approximately 0.7$\mu$ in width, in which arsenic is diffused as the impurity and being of the order of $1 \times 10^{10}$/cc.; an n region 5, approximately 5.0$\mu$ in width, in which arsenic is diffused as the impurity and being of the order of $1 \times 10^{10}$/cc. by the selective diffusion method; and leads 11 and 12 and a control electrode 13, all of which are installed on the diode structure in the manner illustrated.

When a reverse bias of approximately 300 volts (which corresponds to a reverse bias current of approximately 300$\mu$a.) is applied across the leads 11 and 12 with the control electrode 13 and the lead 12 short-circuited, microwave oscillation at a frequency of approximately 500 mc./s. is sustained. In contrast, when the potential of the control electrode 13 is increased in the negative direction relative to the potential of the lead 12 until a control current of approximately 100 ma. is conducted therebetween, the frequency of oscillation increases up to as high a value as 700 mc./s. Variation of the oscillation frequency with control current in this case is logarithmic, but it is substantially linear for sufficiently small control signals.

Figure 5A:
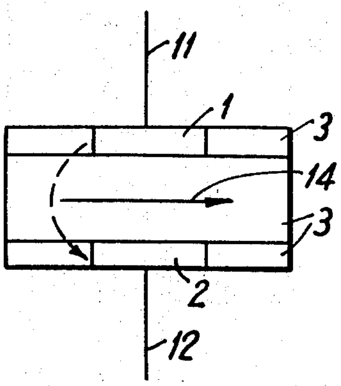
Figure 5B:
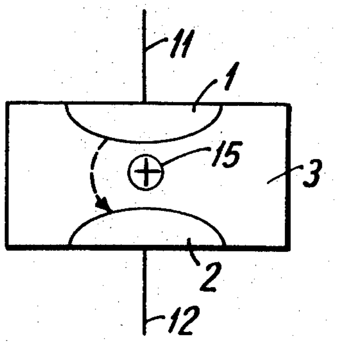

Referring to FIGS. 5*a* and 5*b*, which illustrate schematic cross sections of IMPATT diode structures according to further embodiments of this invention, it will be understood that an electrodynamic field, i.e. electric field 14 or magnetic field 15, is externally applied to the i region 3 of substantially the same p-i-n structure diode as the first embodiment shown in FIG. 2. The paths of the holes generated at the boundaries of regions 1 and 3 and moving towards region 2 will be elongated, in a manner typically indicated by the curve of the broken line arrow, under the influence of the Lorentz force in any of these diodes. As a result, the transit-time of the holes will increase and the operating frequency will decrease.

The structure of the p-i-n diode according to the third embodiment shown in FIG. 5*a* is fabricated by forming the n region 1 and the p region 2 on the top and bottom surfaces of an intrinsic semiconductor wafer 3 respectively by the selective epitaxial growth method and thereafter, forming the top and the bottom annular intrinsic region 3 concentrically with the regions 1 and 2 by the same epitaxial growth process. The structure of the p-i-n diode shown in FIG. 5*b* can be fabricated by forming the n region 1 and the p region 2 in an intrinsic semiconductor wafer 3 by either the impurity diffusion or the alloying process using two metals respectively containing p and n type impurities.

It will be evident with any one of these IMPATT diodes that the frequency of microwave oscillations that has been generated can be raised or lowered by suitably controlling the intensity of the electric field 14 or the magnetic field 15 produced in the intrinsic region 3.

It can well be anticipated that the frequency response of the variable microwave frequency is subject to change by suitably selecting the dimensional proportions of each conductivity type region in fabricating the IMPATT diodes of this invention.

To conclude, the present invention teaches a new structure and method whereby the operating frequencies of IMPATT diodes may be controlled in a desired manner and has important advantages, such as ease with which frequency modulation or frequency sweep at microwave frequencies can be performed. The principles of this invention are applicable to various IMPATT diodes whose operating mechanism utilizes the phenomenon of avalanche breakdown and the transit-time of drift carriers for generation of microwave oscillations, such as the Read, p-n, and p-i-n diodes, provided an external frequency-controlling means is associated therewith in either of the two ways already mentioned, and succinctly stated as follows:

(1) External injection of carriers with a particular sign into the drift region to cause displacement of the position at which the recombination occurs, thereby changing the effective drift distance;

(2) External application of an electric or a magnetic field to the drift region to impart curvature for the paths of drift carriers (electrons or holes), thereby to elongate the effective drift distance of these carriers.

It is believed that the effect described above is applicable not only to the IMPATT diode structures as set forth as the preferred embodiments, but can also be used with MOS diode structures other than the one illustrated or by injecting other kinds of charged particles into the depletion layer from a vacuum.

While the invention has been particularly shown and described with reference to certain preferred embodiments thereof, it will be understood by those skilled in the art that various changes in details may be made without departing from the scope of the invention as set forth in the following claims.

What is claimed is:

1. A variable-frequency semiconductor IMPATT microwave oscillator comprising a region of a first conductivity type, a region of a second conductivity type and an intrinsic type region forming a drift region therebetween, terminal means connected to the regions of first and second conductivities for applying a reverse bias voltage across the semiconductor, and means for externally controlling the frequency of oscillation including means for injecting a selectively variable density of carriers into the drift region having an opposite polarity to the drift carriers in at least partial combination of injected and drift carriers to control the transit time of the drift carriers through the intrinsic region thereby controlling the frequency of said oscillator.

2. The semiconductor of claim 1 wherein the means for externally controlling the frequency of oscillation comprises an electrode and an additional region of first polarity, said additional region directly adjacent to said region of second polarity, whereby a potential of said first polarity may be applied to said electrode in order to cause carriers of said first polarity to be injected into said drift region.

3. The semiconductor of claim 1 wherein the means for externally controlling the frequency of oscillation comprises an electrode, an insulating region directly adjacent said region of first polarity, and a metal region directly adjacent said insulating region and connected to said electrode whereby a potential of said first polarity may be applied to said electrode in order to cause carriers of said first polarity to be injected into said drift region.

4. A variable-frequency semiconductor IMPATT microwave oscillator comprising a region of a first conductivity type, a region of a second conductivity type and an intrinsic type region forming a drift region therebetween, terminal means connected to the regions of first and second conductivities for applying a reverse bias voltage across the semiconductor, and means external of said semiconductor for generating electrodynamic fields in said oscillator to alter the paths of drift carriers traversing the intrinsic region thereby controlling the frequency of the oscillator.

References Cited

UNITED STATES PATENTS

| | | | |
|---|---|---|---|
| 2,767,358 | 10/1956 | Early | 317—239 |
| 2,790,037 | 4/1957 | Shockley | 317—235 X |
| 2,895,109 | 7/1959 | Weinreich | 317—235 X |
| 3,385,981 | 5/1968 | Mayer et al. | 307—299 |
| 3,398,334 | 8/1968 | Shockley | 317—234 |
| 3,424,910 | 1/1969 | Mayer et al. | 317—235 X |
| 3,426,295 | 2/1969 | De Loach, Jr., et al. | 317—235 X |

JAMES D. KALLAM, Primary Examiner

U.S. Cl. X.R.

317—235